(12) United States Patent
Kasai et al.

(10) Patent No.: US 10,479,075 B2
(45) Date of Patent: Nov. 19, 2019

(54) PRINT HEAD SUBSTRATE AND METHOD OF MANUFACTURING THE SAME, AND SEMICONDUCTOR SUBSTRATE

(71) Applicant: CANON KABUSHIKI KAISHA, Tokyo (JP)

(72) Inventors: Ryo Kasai, Tokyo (JP); Masataka Sakurai, Kawasaki (JP); Koichi Ishida, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/953,553

(22) Filed: Apr. 16, 2018

(65) Prior Publication Data

US 2018/0326725 A1 Nov. 15, 2018

(30) Foreign Application Priority Data

May 9, 2017 (JP) .................. 2017-092996
Mar. 28, 2018 (JP) .................. 2018-062753

(51) Int. Cl.
| B41J 2/155 | (2006.01) |
| B41J 2/14 | (2006.01) |
| B41J 2/16 | (2006.01) |
| B41J 2/21 | (2006.01) |
| H01L 21/78 | (2006.01) |

(Continued)

(52) U.S. Cl.
CPC .......... *B41J 2/14072* (2013.01); *B41J 2/155* (2013.01); *B41J 2/1601* (2013.01); *B41J 2/1635* (2013.01); *B41J 2/2103* (2013.01); *H01L 21/78* (2013.01); *H01L 22/34* (2013.01); *H01L 23/4824* (2013.01); *H01L 23/544* (2013.01); *H01L 23/564* (2013.01); *H01L 23/585* (2013.01); *B41J 2202/13* (2013.01); *B41J 2202/18* (2013.01); *B41J 2202/20* (2013.01); *H01L 2223/5446* (2013.01)

(58) Field of Classification Search
None
See application file for complete search history.

(56) References Cited

U.S. PATENT DOCUMENTS

| 6,779,871 B1 | 8/2004 | Seto et al. |
| 9,597,893 B2 | 3/2017 | Kudo et al. |

(Continued)

FOREIGN PATENT DOCUMENTS

| EP | 0670219 A2 | 9/1995 |
| EP | 1316424 A2 | 6/2003 |

(Continued)

OTHER PUBLICATIONS

European Extended Search Report dated Oct. 11, 2018, in counterpart application EP 18168665.0 (13 pages).

*Primary Examiner* — Matthew Luu
*Assistant Examiner* — Tracey M McMillion
(74) *Attorney, Agent, or Firm* — Venable LLP

(57) ABSTRACT

A print head substrate includes: a substrate surface including a plurality of printing elements and a plurality of pads disposed along a first side and electrically connected to the printing elements, the substrate surface having an acute angle portion formed by the first side and a second side; and a test element group (TEG) area including a TEG not electrically connected to the printing elements, at least a part of the TEG area being located between the second side and a pad closest to a vertex of the acute angle portion among the pads.

20 Claims, 9 Drawing Sheets

(51) Int. Cl.
  *H01L 21/66* (2006.01)
  *H01L 23/482* (2006.01)
  *H01L 23/544* (2006.01)
  *H01L 23/00* (2006.01)
  *H01L 23/58* (2006.01)

(56) References Cited

U.S. PATENT DOCUMENTS

| | | |
|---|---|---|
| 9,604,453 B2 | 3/2017 | Yamato |
| 2006/0256160 A1 | 11/2006 | Ozaki et al. |
| 2012/0064644 A1 | 3/2012 | Leigh et al. |
| 2016/0193834 A1 | 7/2016 | Yamato |

FOREIGN PATENT DOCUMENTS

| | | |
|---|---|---|
| EP | 1338419 A1 | 8/2003 |
| EP | 1767365 A1 | 3/2007 |
| EP | 3012107 A1 | 4/2016 |
| JP | 2016-124234 A | 7/2016 |

PRINT HEAD SUBSTRATE AND METHOD OF MANUFACTURING THE SAME, AND SEMICONDUCTOR SUBSTRATE

BACKGROUND OF THE INVENTION

Field of the Invention

The present invention relates to a print head substrate and a method of manufacturing the same, and a semiconductor substrate.

Description of the Related Art

Some inkjet printing apparatuses include a print head which has a length corresponding to the width of the printing medium and are called full-line print heads. In some of the full-line print heads, multiple print head substrates are used to form a single long-length print head. Japanese Patent Laid-Open No. 2016-124234 (hereinafter referred to as PTL 1) discloses a technique of forming a full-line print head by arraying in a line, print head substrates each being a semiconductor chip and having a parallelogram or a trapezoid shape.

A print head substrate having a parallelogram or a trapezoid shape, as disclosed in PTL 1, has acute angle portions. The acute angle portion has low mechanical strength. Unlike typical ICs, the print head substrates of an inkjet printing apparatus sometimes come into contact with a sheet being conveyed. In addition, in an operation of wiping ink attached to the head, the pressure of the wiper may be exerted on the substrates. For this reason, the electrical reliability at the acute angle portions may deteriorate because of the low strength.

In addition, the stress distribution and the heat distribution at the acute angle portion are poorer than those of the inner part of the substrate. Thus, the acute angle portion is not suitable as a place for disposing circuits sensitive to the variations in characteristics of transistors, such as high-speed drive circuits or analog circuits. Further, the shape itself of an acute angle portion is not suitable for a circuit block, and it is difficult to design a layout of a circuit block, fitting it to the shape of the acute angle portion. Such restriction on circuit layout sometimes increases the area of a substrate.

SUMMARY OF THE INVENTION

A print head substrate according to an aspect of the present invention includes: a substrate surface including a plurality of printing elements and a plurality of pads disposed along a first side and electrically connected to the printing elements, the substrate surface having an acute angle portion formed by the first side and a second side; and a test element group (TEG) area including a TEG not electrically connected to the printing elements, at least a part of the TEG area being located between the second side and a pad closest to a vertex of the acute angle portion among the pads.

Further features of the present invention will become apparent from the following description of exemplary embodiments with reference to the attached drawings.

DESCRIPTION OF THE EMBODIMENTS

Figure 1:
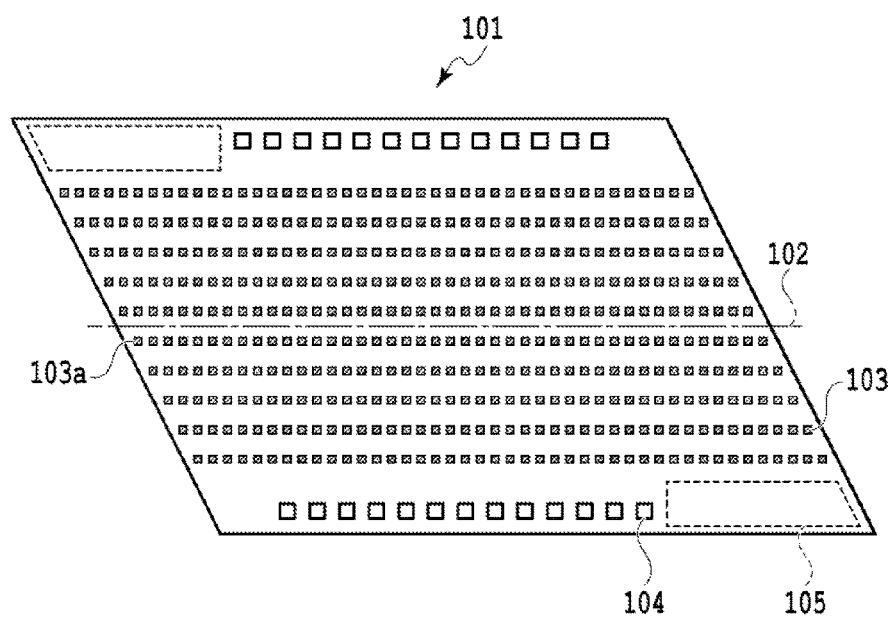
FIG. 1 is a diagram illustrating the layout of a print head substrate.

Hereinafter, embodiments of the present invention will be described with reference to the drawings. Note that the following embodiments are not for limiting the present invention, and all the combined features described in the embodiments are not necessarily essential to the solutions in the present invention. Note that the same constituents will be denoted by the same reference numerals in the explanation. In addition, the relative arrangements, the shapes, and the like of the constituents described in the embodiments are merely examples and do not mean that the scope of the present invention is limited only to them.

Embodiment 1

FIG. 1 is a diagram illustrating a print head substrate 101 of this embodiment. Multiple print head substrates 101 are arrayed to constitute a long-length print head (FIG. 9B). The print head substrate 101 has a parallelogram shape. The print head substrate 101 is a semiconductor chip. The print head substrate 101 cut out in the shape as illustrated in FIG. 1 is obtained by forming patterns of local work-affected layers with laser light focused inside a wafer substrate and cleaving the substrate along the formed patterns. In this way, the shape of the print head substrate 101 is formed by dicing called stealth dicing. In the print head substrate 101 of FIG. 1, two corners in FIG. 1, the lower-right corner and the upper-left corner, are acute angle portions.

On the print head substrate 101, heaters 103 are lined up in multiple rows in an array shape. The heaters 103 are printing elements for ejecting ink for printing. In other words, the heaters 103 are heating elements for generating bubbles to eject liquid. Note that in case of adopting the piezo method or other liquid ejection methods, printing elements adapted for the methods are used. The rows of the heaters 103 are arranged to have the same intervals between the rows.

On the print head substrate 101, electrode pads (hereinafter called "PADs") 104 are lined up along the long sides of the print head substrate 101. The PADs 104 are electrode pads used for driving the heaters 103. In other words, the PADs 104 are electrode pads for driving specific elements (heaters 103) used for the primary use of the print head substrate 101. The primary use for the print head substrate means printing. The PADs 104 are connected to the internal circuit of the print head substrate 101. In other words, the PADs 104 are electrode pads electrically connected to the heaters 103.

In the print head substrate 101 of this embodiment, TEG areas 105 are disposed between an acute angle portion of the print head substrate 101 and the PADs 104 closest to the acute angle portion. The TEG area is an area including elements and circuits for evaluation called a test element group (TEG). For example, a TEG area includes a TEG of at least one of transistors, wiring, resistance elements, printing elements, and plugs. These are not used for the primary use (printing in this embodiment) of the print head substrate 101. In other words, the TEG includes elements not electrically connected to the heaters 103. For example, the TEG is used for process monitoring to manage wafer manufacturing processes. Alternatively, the TEG may be used for obtaining device characteristics of the printing elements.

Defining the long side of the print head substrate 101 as a first side of the two sides forming the acute angle portion of the print head substrate 101, the PADs 104 are lined up along the first side. Then, the TEG area 105 is disposed between a second side of the two sides forming the acute angle portion of the print head substrate 101 and the PAD 104 closest to the second side among the multiple PADs lined up. In other words, the TEG area 105 is disposed such that at least a part of it is located between the second side and the PAD 104 closest to the vertex of the acute angle portion. In addition, the position where the TEG area 105 is disposed does not overlap with an area where the heaters 103 are disposed.

In the print head substrate 101 of this embodiment, the circuitry on the upper side and the circuitry on the lower side in FIG. 1 are electrically separated. Specifically, the circuitry of the print head substrate 101 is separated at a chip separation border line 102 which is in parallel with the two long sides of the print head substrate 101 and passes through the center of the print head substrate 101. As for the arrangement and the circuit layout of the heaters 103, and the arrangement of the PADs 104, the upper part and the lower part are point symmetrical. In this embodiment, the TEG areas 105 are disposed at the lower-right portion and the upper-left portion in FIG. 1, at two portions in total. The TEG can be used for various evaluations. The larger number of TEGs, the higher the accuracy of evaluation is. For this reason, in this embodiment, the TEG areas 105 are disposed at both of the two acute angle portions of the print head substrate 101. However, the present invention is not limited to this example, but can be applied in the case where a TEG area 105 is disposed at a position corresponding to at least one of the acute angle portions included in the print head substrate 101.

Figure 2:
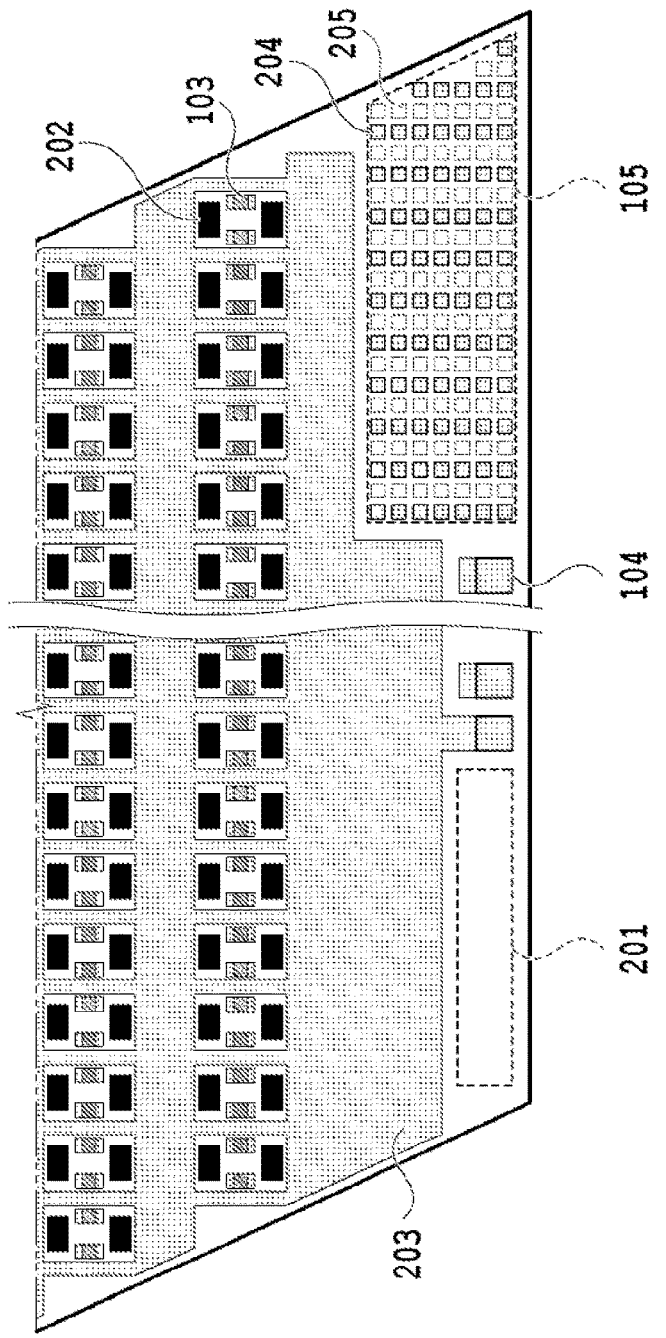
FIG. 2 is a diagram illustrating details of the print head substrate.

FIG. 2 is a diagram illustrating details of the print head substrate 101 illustrated in FIG. 1. It is assumed that the print head substrate 101 of this embodiment is formed by a four-layer wiring process. FIG. 2 illustrates the pattern layouts of a heater layer and a wiring layer (fourth layer) of the print head substrate 101 in FIG. 1. Here, among wiring layers, a layer on the side of the layer on which the heaters 103 of the print head substrate 101 are arrayed is called an upper layer. The heaters 103 are heating elements for generating bubbles and ejecting ink. Independent supply ports 202 are supply ports for supplying ink to be ejected by bubbles. Multiple independent supply ports 202 are formed in the print head substrate 101. Wiring 203 is wiring with a solid trace. The trace of the wiring 203 includes traces in beam shapes passing between independent supply ports 202. The trace of the wiring 203 does not overlap with the TEG area 105.

Figure 3:
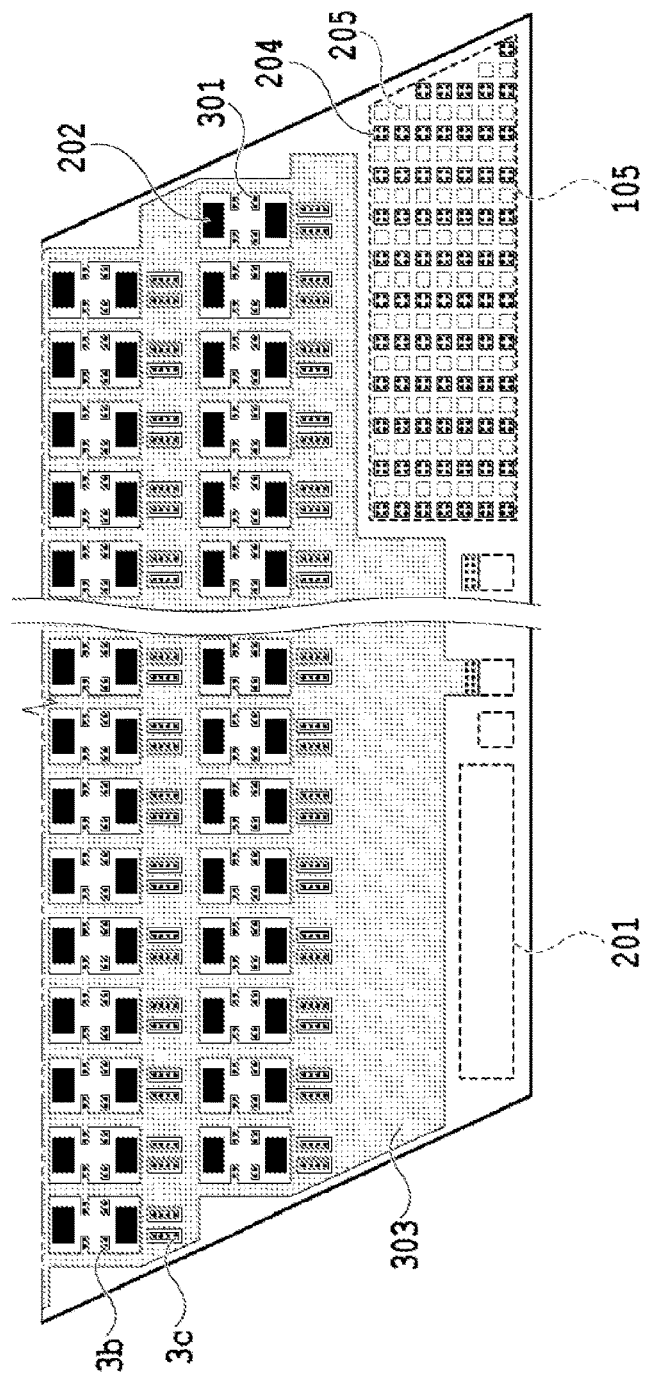
FIG. 3 is a diagram illustrating details of the print head substrate.

FIG. 3 is a diagram illustrating a pattern layout of a wiring layer (third layer) and plugs of the print head substrate 101. Plugs 301 are plugs connected to the wiring 203 (in the fourth layer) in FIG. 2. In addition to the plugs 301, there are other plugs connected to wiring in a lower layer (second layer), illustration of which is omitted here. Wiring 303 is wiring with a solid trace. The trace of the wiring 303 does not overlap with the TEG area 105.

Figure 4:
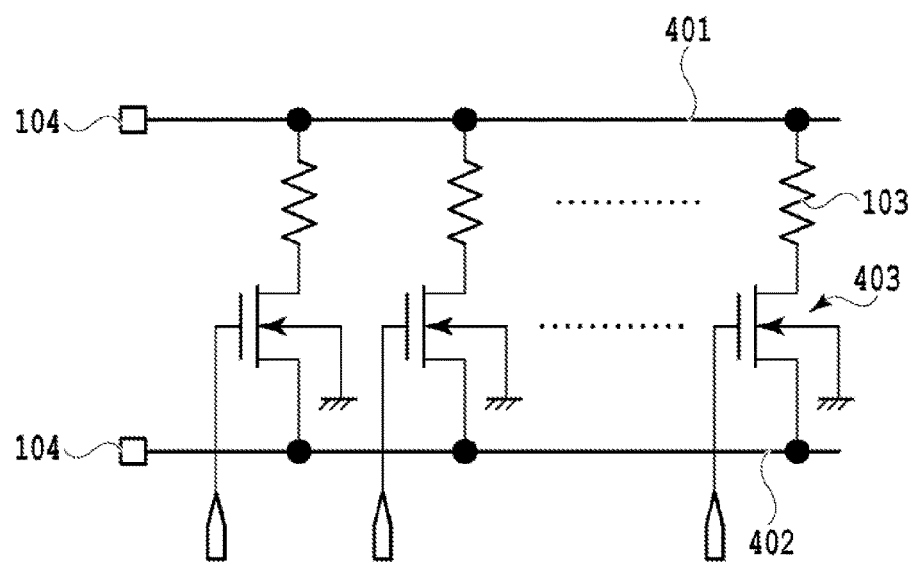
FIG. 4 is a diagram illustrating the connection circuit of heaters.

FIG. 4 is a diagram illustrating the connection circuit diagram of the heaters 103. The connection configuration of the heaters 103 will be described using FIGS. 2 to 4. As illustrated in FIG. 4, each heater 103 and each driver transistor 403 are connected to a common heater power supply 401 and a common heater GND 402. The heater GND 402 has the trace of the wiring 203 illustrated in FIG. 2. The trace of this wiring 203, having a solid trace extending over the rows of the heaters, are connected to driver transistors 403 in multiple rows. The heater power supply 401 has the trace of the wiring 303 illustrated in FIG. 3. The wiring 303, also having a solid trace in the same way as for the wiring 203, is connected to the multiple heaters 103 in each row via the plugs 301. In this way, the heater power supply 401 and the heater GND 402 in FIG. 4 are formed of two, upper and lower, layers of power supply wiring traces with wide solid shapes overlapping with each other as illustrated in FIGS. 2 and 3.

Traces 3b in FIG. 3 are wiring traces connecting the heaters 103 and the driver transistors 403. Traces 3c in FIG. 3 formed in cut-out portions in the solid trace are traces connecting the driver transistors 403 and the heater GND 402. In this way, with the wiring traces illustrated in FIGS. 2 and 3, the heater power supply 401 and the heater GND 402 in FIG. 4 are connected to the heaters 103 and the driver transistors 403.

Returning to FIG. 1, the voltage loss of the heater 103 will be described. In the print head substrate 101 having the wiring trace described above, the voltage loss caused by parasitic wiring resistance is the largest at the furthest heaters 103a from the PADs 104. In other words, the further the distance between the heater 103 and the PAD 104 is, the larger the effect of the voltage loss is. If the voltage loss is large, it is necessary to make the heat pulses large. Accordingly, other heaters to which the same pulses are applied receive excessive energy, which may shorten the life of the heaters 103. Here, in this embodiment, the TEG area is disposed between the acute angle portion of the print head substrate 101 and the PAD 104 closest to the acute angle portion. The TEG area 105, disposed at such a position, will not affect the voltage loss of the heaters 103a. Specifically, TEG PADs 204 (second pads) (see FIGS. 2 and 3) located far from the heaters 103 are not used for the heaters 103 but used for the TEG 205 (see FIGS. 2 and 3). Thus, by disposing the TEG area between the acute angle portion of the print head substrate 101 and the PAD 104 closest to the acute angle portion, it is possible to utilize the area around the acute angle portion effectively. In other words, in the print head substrate 101 having a parallelogram described in FIG. 1, the TEG 205 disposed in the area around the acute angle portion will not impair the electrical characteristics of the print head substrate 101.

In addition, in the print head substrate 101 of this embodiment, the PADs 104 are shifted to the obtuse angle portion side to reduce the voltage loss at the heaters 103a. Accordingly, a wide vacant area remains at the acute angle portion end. In other words, the distance between the second side and the PAD 104 closest to the vertex of the acute angle portion among the multiple PADs 104 is larger than the distance between the third side opposed to the second side and the PAD 104 closest to the vertex of the obtuse angle portion among the multiple PADs 104. At the acute angle portion, the substrate strength is low. Also, from the view point of stress distribution and heat distribution, as well as the efficiency of layout, the acute angle portion is not suitable for the arrangement of circuitry. Accordingly, a vacant area at the acute angle portion end will not cause any problem. On the other hand, the TEG is basically not used in the state of a substrate after being cut out. Thus, if the area around the acute angle portion is used as a TEG area, the area of the print head substrate 101 can be utilized effectively. Similarly, multiple PADs 104 arrayed along the side opposed to the first side may also be shifted toward the obtuse angle portion side.

In this way, disposing the TEG area 105 around the acute angle portion in the print head substrate 101 having a parallelogram, makes it possible to dispose the TEG without impairing the electric characteristics and the electric reliability of the print head substrate 101. Further, for the print head substrate 101 of this embodiment, a TEG can be disposed for every chip. Accordingly, in this case, detailed process management can be performed for the wafer surface, and the yield can be improved.

Note that as described above, disposing circuit blocks along the acute angle portion shape is restricted in layout and is difficult. However, the TEG can be disposed effectively even at the acute angle portion because the TEG is constituted of elements and the unit blocks are small. In addition, comparing to the case of disposing a TEG in an area to be diced away or using a chip for a TEG, as an approach used in conventional process management of the wafer surface, the chip yield per wafer can be increased. Thus, it is possible to achieve cost reduction.

Note that as illustrated in FIGS. 2 and 3, a mark accessory area 201 is provided in this embodiment. A mark accessory area is an area in which marks or accessory patterns are formed for positioning the wafer during processing. The mark accessory area 201 may be located in another area, and the area 201 may be used as an aluminum (Al) wiring area.

Although in the print head substrate 101 in FIG. 1, the shape of the substrate surface on which the heaters 103 are arrayed is a parallelogram as an example, the present invention is not limited to this example. The upper side and the lower side do not need to be in parallel. The right and left oblique sides do not need to be in parallel. The shape only needs to have an acute angle portion.

In addition, the TEG disposed in the TEG area 105 does not need to be a TEG used for semiconductor process management. For example, the characteristics of heaters or those of driver transistors may be obtained from the TEG. Then, drive pulses suitable for each print head substrate 101 may be provided. In other words, the TEG may be used for obtaining device characteristics of printing elements.

In this embodiment, in the print head substrate 101 having acute angle portions like a parallelogram, the TEG areas 105 are disposed at the areas around the acute angle portions of the print head substrate 101, as described above. This makes it possible to effectively use the areas around acute angle portions which had been difficult to use. This also makes it possible to reduce the substrate area without impairing the electrical characteristics and thus achieve the cost reduction.

Even if the acute angle portion having a low strength receives damage, for example, from wiping pressure or the contact with conveyed paper, the print head can be driven normally. Thus, in the print head substrate 101 of this embodiment, no damage will be caused at the print head and the electrical system of the body, and thus it is possible to keep the high electrical reliability. Further, since the TEG is disposed on every print head substrate 101, device characteristic management during the semiconductor process can be performed for every substrate, making it possible to increase the yield. In addition, by performing control adjusted to the characteristic of every print head substrate, it is possible to achieve high functionality.

Embodiment 2

Descriptions have been provided for embodiment 1, using the case where the shape of the print head substrate is a parallelogram, as an example. In this embodiment, descriptions will be provided using the case where the shape of a print head substrate is a trapezoid, as an example.

Figure 5:
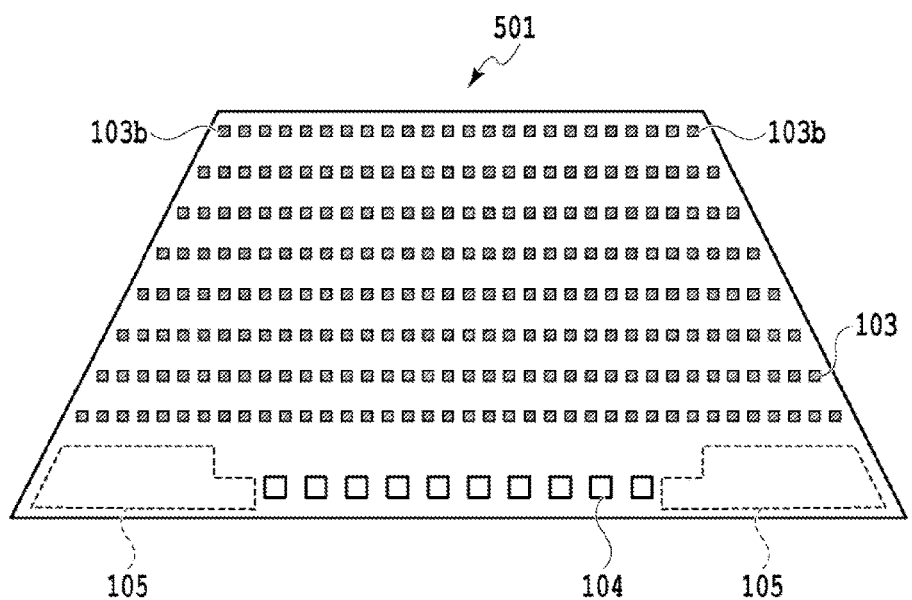
FIG. 5 is a diagram illustrating the layout of a print head substrate.

FIG. 5 shows a trapezoidal print head substrate 501 in this embodiment. On the print head substrate 501, the PADs 104 are lined up along the longest side. This longest side forms acute angle portions. The TEG areas 105 are disposed on both the acute angle portion sides of the print head substrate 501. The print head substrate 501 does not have a chip separation border line 102 as in FIG. 1 and has the PADs 104 arrayed along one side of the substrate. The PADs 104 and the heaters 103 are disposed symmetrically. Although not illustrated, the power is supplied to the heaters 103 in each row with the same Al wiring trace as in FIGS. 2 and 3 of Embodiment 1. In the substrate shape and the heater arrangement like this, the heaters 103 at which the voltage drop is the largest are heaters 103b. The TEG areas 105 are disposed at positions where the TEG areas 105 do not interfere with the heater current paths from the PADs 104 to the heaters 103b. Note that although FIG. 5 shows an example of a symmetrical layout, the layout may be unsymmetrical. In addition, although an example of a trapezoid shape is shown, the upper base and the lower base do not need to be in parallel. The angles of the right and the left acute angle portions may be different.

As has been described above, even in the case where the shape of a print head substrate is not a parallelogram, the same effect as in Embodiment 1 can be obtained by disposing TEG areas around the acute angle portions.

Embodiment 3

In Embodiment 3, descriptions will be provided for a print head substrate in which a moisture-resistant ring is formed. A moisture-resistant ring is a member commonly used in a semiconductor substrate using a planarization process such as chemical mechanical polishing (CMP). The moisture-resistant ring serves as a wall for protecting devices in the chip against the moisture from the chip cutting wall surfaces.

Figure 6:
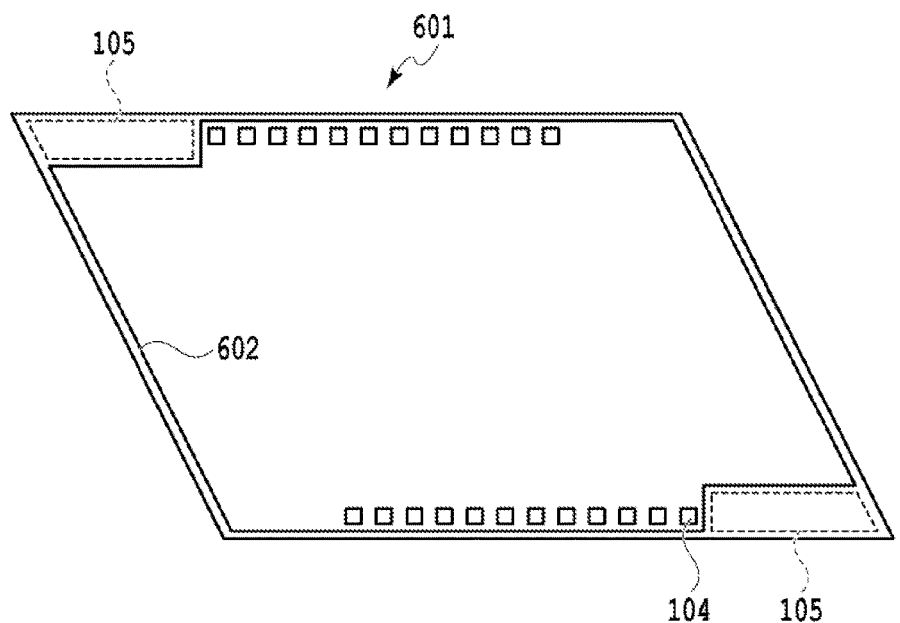
FIG. 6 is a diagram illustrating the layout of a moisture-resistant ring.

FIG. 6 illustrates the pattern of a moisture-resistant ring 602 in this embodiment. It is assumed that a print head substrate 601 has the same configuration as that of the print head substrate 101 described in Embodiment 1 except that the moisture-resistant ring 602 is formed in the print head substrate 601. As described in FIG. 6, the print head substrate 601 of this embodiment has a configuration in which a drive circuit area including the PADs 104 and wiring traces and TEG areas 105 are separated by the moisture-resistant ring 602. Specifically, in the print head substrate 601, the shape of the moisture-resistant ring 602 is formed to exclude the TEG areas 105 from the area protected by the moisture-resistant ring 602.

Figure 7:
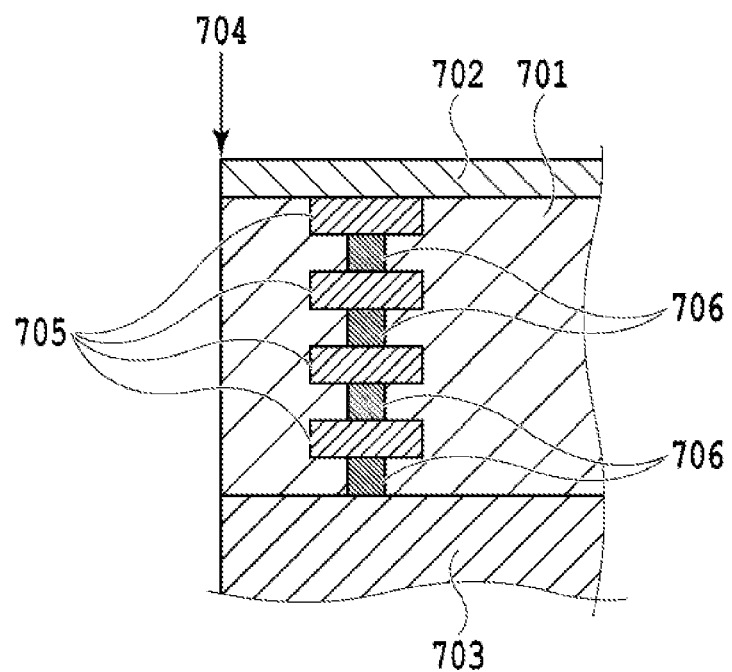
FIG. 7 is a cross-sectional view of the moisture-resistant ring.

FIG. 7 is a diagram illustrating an example of a cross-sectional structure of the moisture-resistant ring 602. Oxide film 701 and passivation film 702 are formed on a Si substrate 703. As illustrated in FIG. 7, the moisture-resistant ring 602 is typically formed by arranging plugs 706 and wiring 705 in a slit shape and surrounding the outermost periphery of the Si substrate 703 without leaving a blank.

Since the TEG areas 105 are excluded from the area protected by the moisture-resistant ring 602, even if damage is caused to the acute angle portions and a crack occurs, the internal circuit will not receive electrical damage if the location of the damage is outside the moisture-resistant ring 602 (in other words, on the chip end 704 side). In addition, since the acute angle portions receive large stress, there is a concern that nozzle material peels off, ink penetrates the inside, and moisture enters the oxide film 701 in the print head substrate 601 via the TEG PAD 204. However, in this embodiment, the internal circuit is protected by the moisture-resistant ring 602. Thus, the internal circuit will receive no damage. Further, the TEG 205 in the TEG area 105 is mainly used during the manufacturing process. Hence, even if the device characteristics of the TEG 205 have been changed during the printing operation of the printing apparatus on which the print head substrate 601 is mounted, it will cause no particular problem.

Figure 8:
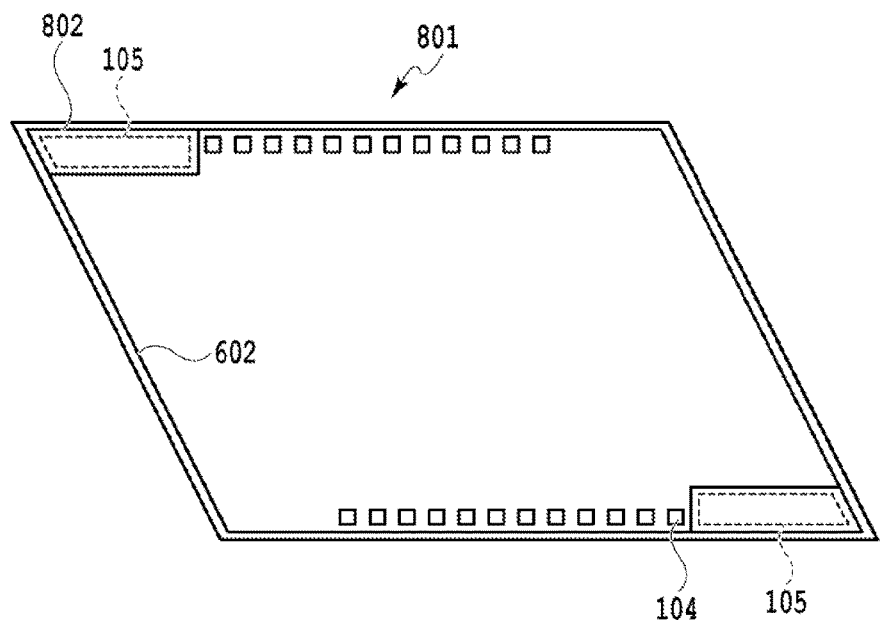
FIG. 8 is a diagram illustrating the layout of moisture-resistant rings.

Note that in this embodiment, descriptions have been provided for the configuration in which the TEG areas 105 are disposed outside the moisture-resistant ring 602. However, the present invention is not limited to this configuration. A wall of the moisture-resistant ring only needs to be formed between the heater drive circuit area and the TEG areas 105. For example, as illustrated in FIG. 8, the moisture-resistant ring may have a duplex configuration, and the TEG areas 105 may be disposed inside second moisture-resistant rings 802.

In the above embodiments, descriptions have been provided for the configurations in which a print head substrate has a shape including an acute angle portion, such as a parallelogram or a trapezoid as typical examples. When dicing a substrate having such a shape, stealth dicing is advantageous because it has higher flexibility in the shape for dicing, compared to blade dicing. Meanwhile, since in blade dicing, a substrate is divided by cutting the substrate with a blade, scribe areas corresponding to the width of the blade are cut away from the wafer substrate. Since a TEG is generally unnecessary after the wafer manufacturing process, the TEG is disposed in this scribe area to utilize the wafer substrate area effectively in the case where blade dicing is used. On the other hand, since the stealth dicing divides a substrate by cleaving, the width of dicing is zero. Accordingly, even if a TEG is disposed in a scribe area in the same way as in blade dicing, the TEG will remain in the periphery of a side of the substrate after stealth dicing. For this reason, this TEG may be an obstacle when electrical parts are mounted, such as wire bonding of electrode pads disposed in the periphery of a side of the substrate. However, in the embodiments, disposing a TEG arrangement area around an acute angle portion of the substrate, where it is difficult to dispose circuitry, reduces the risk of the TEG hindering mounting operation of electrical parts, making it possible to utilize the substrate area more effectively.

<Recoding Head and Printing Apparatus>

Descriptions will be provided for examples of an inkjet print head to which a printing element substrate according to the embodiments described above is mounted, and a printing apparatus including the inkjet print head.

Figure 9A:
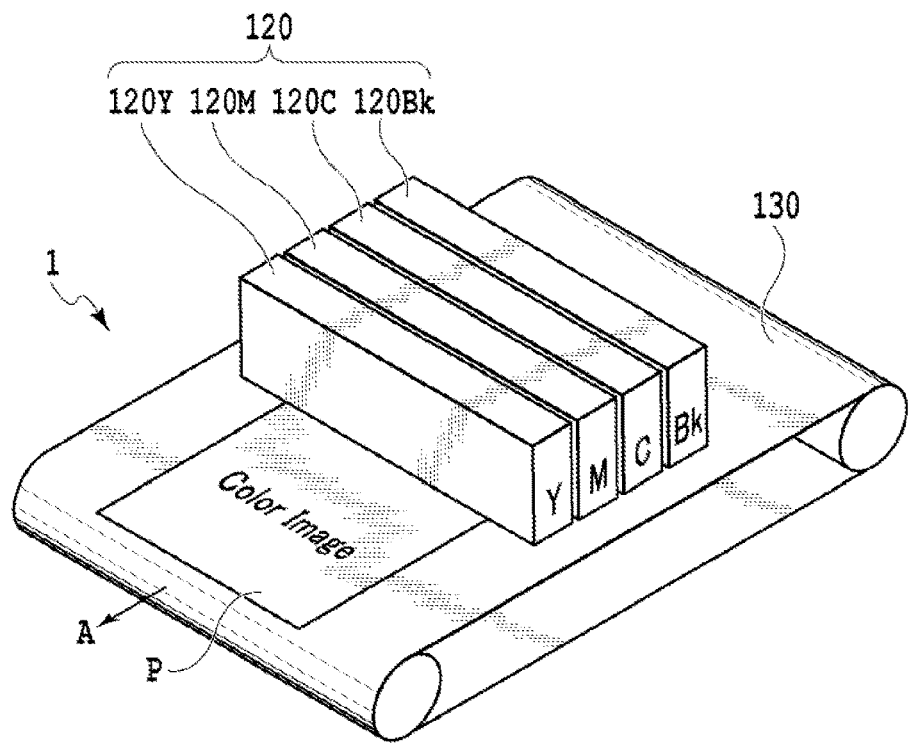
FIG. 9A is a diagram illustrating a configuration example of a printing apparatus.
Figure 9B:
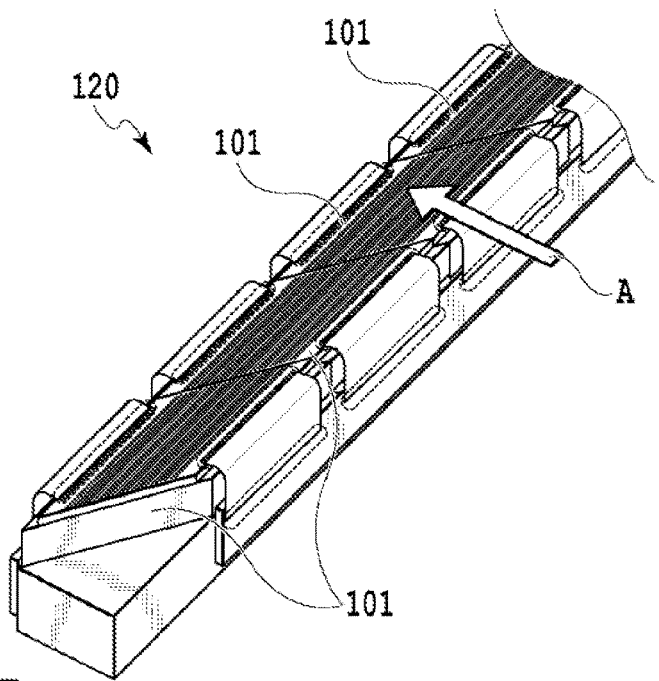
FIG. 9B is a diagram illustrating a configuration example of a print head.

FIG. 9A is a schematic perspective view for explaining a configuration example of an inkjet printing apparatus 1 including an inkjet print head 120. The printing apparatus 1 in this example is of a system called full-line, and includes a long-length print head 120 extending over the entire area in the width direction of a printing medium P. The printing medium P is continuously conveyed in the arrow A direction by a conveyance mechanism 130 including a conveyance belt and other parts. While the printing medium P is being conveyed in the arrow A direction, ink (liquid) is ejected from the print heads 120 to print an image onto the printing medium P. In this embodiment, print heads 120C, 120M, 120Y, and 120Bk ejecting ink in cyan (C), magenta (M), yellow (Y), and black (K), respectively, are used as the print head 120 to print a color image.

FIG. 9B is a perspective view of the print head 120. The print head 120 of this embodiment is a full multi-head in which multiple print head substrates 101 are disposed along the direction intersecting (in this embodiment, orthogonal to) the conveyance direction of the printing medium P (arrow A direction). Since the print head substrate 101 of this embodiment has acute angle portions on the substrate surface, multiple print head substrates 101 can be lined up linearly, and adjacent print head substrates 101 are connected to each other to constitute the print head 120. This reduces the length (width) of the print head 120 in the conveyance direction of the printing medium P.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-092996, filed May 9, 2017, and No. 2018-062753, filed Mar. 28, 2018, which are hereby incorporated by reference wherein in their entirety.

What is claimed is:

1. A print head substrate comprising:
   a substrate surface including a plurality of printing elements and a plurality of pads disposed along a first side and electrically connected to the printing elements, the substrate surface having an acute angle portion formed by the first side and a second side; and
   a test element group (TEG) area including a TEG not electrically connected to the printing elements, at least a part of the TEG area being located between the second side and a pad closest to a vertex of the acute angle portion among the pads.

2. The print head substrate according to claim 1, wherein the TEG area does not overlap with an area in which the printing elements are disposed.

3. The print head substrate according to claim 1, wherein the substrate surface has a plurality of the acute angle portions, and
   the TEG area is disposed at a position corresponding to at least one of vertexes of the acute angle portions.

4. The print head substrate according to claim 1, wherein a shape of the substrate surface is a parallelogram.

5. The print head substrate according to claim 1, wherein a shape of the substrate is a trapezoid.

6. The print head substrate according to claim 1, wherein the TEG includes at least one of a transistor, wiring, a resistance element, a printing element, and a plug, and the TEG and a second pad connected to the TEG are disposed in the TEG area.

7. The print head substrate according to claim 1, wherein the TEG is used for process monitoring of managing a wafer manufacturing process.

8. The print head substrate according to claim 1, wherein the TEG is used for obtaining a device characteristic of the printing elements.

9. The print head substrate according to claim 1, wherein at least two of the printing elements are connected in common to a wiring trace extended from the pads.

10. The print head substrate according to claim 9, wherein the wiring trace does not overlap with the TEG area.

11. The print head substrate according to claim 9, wherein an area including the pads, the wiring trace, and the printing elements is separated from the TEG area by a moisture-resistant ring.

12. The print head substrate according to claim 11, wherein
the moisture-resistant ring surrounds an area including the pads, the wiring trace, and the printing elements, and
the TEG area is disposed outside the moisture-resistant ring.

13. The print head substrate according to claim 11, wherein
the print head substrate includes a second moisture-resistant ring surrounding the TEG area.

14. The print head substrate according to claim 1, wherein the substrate surface has an obtuse angle portion formed by the first side and a third side opposed to the second side, and
a distance between the second side and a pad closest to the vertex of the acute angle portion among the pads is larger than a distance between the third side and a pad closest to a vertex of the obtuse angle portion among the pads.

15. A method of manufacturing a print head substrate, the print head substrate including:
a substrate surface including a plurality of printing elements and a plurality of pads disposed along a first side and electrically connected to the printing elements, the substrate surface having an acute angle portion formed by the first side and a second side; and
a test element group (TEG) area including a TEG not electrically connected to the printing elements, at least a part of the TEG area being located between the second side and a pad closest to a vertex of the acute angle portion among the pads,
the method comprising:
forming a pattern of an affected layer inside a wafer substrate; and
cutting out the print head substrate having the acute angle portion by cleaving the wafer substrate along the formed pattern.

16. A semiconductor substrate comprising:
a substrate surface including a plurality of elements and a plurality of pads disposed along a first side and electrically connected to the elements, the substrate surface having an acute angle portion formed by the first side and a second side; and
a test element group (TEG) area including a TEG not electrically connected to the elements, at least a part of the TEG area being located between the second side and a pad closest to a vertex of the acute angle portion among the pads.

17. The semiconductor substrate according to claim 16, wherein
the TEG area does not overlap with an area in which the elements are disposed.

18. The semiconductor substrate according to claim 16, wherein
a shape of the substrate surface is a parallelogram.

19. The semiconductor substrate according to claim 16, wherein
at least two of the elements are connected in common to a wiring trace extended from the pads.

20. The semiconductor substrate according to claim 19, wherein
the wiring trace does not overlap with the TEG area.

* * * * *